(12) United States Patent
Chung et al.

(10) Patent No.: US 10,387,045 B2
(45) Date of Patent: Aug. 20, 2019

(54) APPARATUS AND METHOD FOR MANAGING BUFFER HAVING THREE STATES ON THE BASIS OF FLASH MEMORY

(71) Applicant: AJOU UNIVERSITY INDUSTRY-ACADEMIC COOPERATION FOUNDATION, Suwon-si, Gyeonggi-do (KR)

(72) Inventors: Tae Sun Chung, Suwon-si (KR); Rize Jin, Suwon-si (KR); Hyung Ju Cho, Yongin-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 476 days.

(21) Appl. No.: 14/902,748

(22) PCT Filed: Jul. 3, 2014

(86) PCT No.: PCT/KR2014/005955
§ 371 (c)(1),
(2) Date: Jan. 4, 2016

(87) PCT Pub. No.: WO2015/002481
PCT Pub. Date: Jan. 8, 2015

(65) Prior Publication Data
US 2016/0196063 A1 Jul. 7, 2016

(30) Foreign Application Priority Data
Jul. 3, 2013 (KR) .................. 10-2013-0077558

(51) Int. Cl.
*G06F 3/06* (2006.01)
*G06F 12/12* (2016.01)
(Continued)

(52) U.S. Cl.
CPC ............. *G06F 3/061* (2013.01); *G06F 3/068* (2013.01); *G06F 3/0619* (2013.01);
(Continued)

(58) Field of Classification Search
CPC ...... G06F 3/061; G06F 3/0619; G06F 3/0659; G06F 3/068; G06F 12/0833;
(Continued)

(56) References Cited

U.S. PATENT DOCUMENTS

2012/0159280 A1 6/2012 Yang et al.

FOREIGN PATENT DOCUMENTS

| KR | 10-0787856 B1 | 12/2007 |
| KR | 10-0941382 B1 | 2/2010 |
| KR | 10-2012-0070408 A | 6/2012 |

OTHER PUBLICATIONS

International Search Report of PCT/KR2014/005955, dated Oct. 13, 2014. [PCT/ISA/210].
(Continued)

Primary Examiner — Gurtej Bansal
(74) Attorney, Agent, or Firm — Sughrue Mion, PLLC

(57) ABSTRACT

The present invention relates to an apparatus and a method for managing a buffer having three states on the basis of a flash memory and, more specifically, to an apparatus and a method for improving the performance of a database management system (DBMS) on the basis of the flash memory and a use life span of a storage device by reducing a writing operation for a flash memory device in which the writing operation is very slow in comparison with a reading operation, through an efficient buffer managing method and a new index node split policy. To this end, the buffer management device having three states on the basis of the flash memory according to an embodiment of the present invention com-
(Continued)

prises: a buffer memory unit; a list management unit; a buffer memory management unit; and a log buffer unit.

10 Claims, 9 Drawing Sheets

(51) Int. Cl.
*G06F 12/08* (2016.01)
*G11C 16/06* (2006.01)
*G06F 12/123* (2016.01)
*G11C 16/34* (2006.01)
*G06F 12/127* (2016.01)
*G06F 12/0831* (2016.01)
*G06F 12/128* (2016.01)
*G06F 12/0868* (2016.01)

(52) U.S. Cl.
CPC ........ *G06F 3/0659* (2013.01); *G06F 12/0833* (2013.01); *G06F 12/123* (2013.01); *G06F 12/127* (2013.01); *G06F 12/128* (2013.01); *G11C 16/06* (2013.01); *G11C 16/349* (2013.01); *G06F 12/0868* (2013.01); *G06F 2212/621* (2013.01)

(58) Field of Classification Search
CPC .. G06F 12/128; G06F 12/0868; G06F 12/127; G06F 12/123; G06F 2212/621; G11C 16/06; G11C 16/349
See application file for complete search history.

(56) References Cited

OTHER PUBLICATIONS

Written Opinion of PCT/KR2014/005955, dated Oct. 13, 2014. [PCT/ISA/237].

FIG. 9

| Algorithm 2. Full Merge Commit |
|---|
| Inputs:      k the first leaf unit of B$^+$-buffer <br>              $\chi$, be the first leaf node of B$^+$-tree |
| Outputs     node |
| 1:        If (k != null and $\chi$ != null) |
| 2:            SortMerge (k, $\chi$) |
| 3:            k = k.next |
| 4:            $\chi$ = $\chi$.next |
| 5:        Flush () |
| 6:        end if |

| Algorithm 3. The SortMerge Procedure |
|---|
| Problem:   Merge two sorted array into one sorted array. |
| Inputs:       Positive integers n and m, array of sorted keys U, <br>               array of sorted keys V. |
| Outputs:   The sorted keys array S. |
| 1:         i ← 1; j ← 1 ; k ← 1 ; l ← 0 |
| 2:         while i <= n and j <= m |
| 3:             if U[i] < V[j] |
| 4:                S[k] = U[i]; |
| 5:                i ← i + 1; |
| 6:             else if U[i] > V[j] |
| 7:                S[k] = V[j] |
| 8:                j ← j + 1 |
| 9:             else if U[i].optype is delete |
| 10:            i ← i + 1; j ← j + 1 |
| 11:            l ← l + 2 |
| 12:            countinue; |
| 13:            end else if |
| 14:            end if |
| 15:            k ← k + 1 |
| 16:      end while |
| 17:      if i > n |
| 18:          copy V[j] through V[m] to S[k] through S[n+m−l] |
| 19:      else |
| 20:          copy U[i] through U[n] to S[k] through S[n+m−l] |
| 21:      end if |

APPARATUS AND METHOD FOR MANAGING BUFFER HAVING THREE STATES ON THE BASIS OF FLASH MEMORY

CROSS REFERENCE TO RELATED APPLICATIONS

This application is a National Stage of International Application No. PCT/KR2014/005955, filed Jul. 3, 2014, and claims priority from Korean Patent Application No. 10-2013-0077558 filed Jul. 3, 2013, the contents of which are incorporated herein by reference in their entireties.

TECHNICAL FIELD

The present invention relates to an apparatus and a method for managing a buffer having three states on the basis of a flash memory and, more specifically, to an apparatus and a method for improving the performance of a database management system (DBMS) on the basis of the flash memory and a use life span of a storage device by reducing a writing operation for a flash memory device in which the writing operation is very slow in comparison with a reading operation, through an efficient buffer managing method and a new index node split policy.

The present invention has been derived from researches conducted as a part of general research support from the Ministry of Education, Science and Technology and the National Research Foundation of Korea [project management number: 1345176071, and project name: study on the system software supporting the next-generation flash memory system].

BACKGROUND ART

A flash memory has a unique physical characteristic which is different from a hard disk in that costs of a reading operation and a writing operation are non-uniform.

In the flash memory, a reading and writing unit (page) and a deleting unit (block) are different from each other, temporal costs (reading: 10 μs, writing: 200 μs, and deleting: 2 ms) are different from each other, and generally, the number of deleting times is limited to 100,000 to 1,000,000 per block.

Further, in order to perform the writing operation at the same position, the deleting operation requiring much time needs to be performed. Accordingly, most of NAND flash memory has a flash translation layer to hide direct cost of the deleting operation by performing an out-place update in which writing is performed at a place out of the same position.

As such, since the flash memory has a unique physical characteristic which is different from the hard disk, it is difficult to expect optimum performance in the NAND flash memory system through an existing page replacement algorithm which seeks only a memory hit ratio.

For example, a least recently used (LRU) algorithm is optimized for a storage system on the basis of the hard disk.

The LRU algorithm maintain pages on the memory as a priority list according to the last reference timing and replaces the earliest referenced page when the memory space is insufficient.

The LRU algorithm has good performance in various environments with time locality to be widely used in not only a virtual memory environment but also various fields such as buffer caching and web caching. However, the costs of the reading and writing operations do not consider characteristics of a heterogeneous flash memory and thus, it is difficult to expect the optimal performance in the flash memory system.

Meanwhile, a clean-first LRU (CFLRU) algorithm is a page replacement algorithm in which the memory hit ratio and the costs of the reading and writing operations consider the physical characteristics of the heterogeneous flash memory.

FIG. 5 is a view illustrating a buffer managing method of a CFLRU algorithm in the related art.

Referring to FIG. 5, the CFLRU algorithm basically manages pages by the LRU list and is divided into a working region which is a space storing the relatively recently referenced pages on the LRU list and a clean-first region which is a space storing the relatively earlier referenced pages on the LRU list. In this case, the clean-first region in the CFLRU algorithm is called a window.

Further, in the CFLRU algorithm, the page is divided into a clean page and a dirty page, the clean page is a page in which the content of the page after being uploaded on the memory is not changed, and the dirty page is a page in which the content of the page after being uploaded on the memory is changed.

In addition, in the CFLRU algorithm, the page is replaced in the clean-first region earlier than the working region, and the clean page is replaced earlier than the dirty page in the clean-first region. The replacement of the dirty page generates the writing operation in the flash memory unlike the replacement of the clean page so as to reduce the high-cost writing operation of the flash memory.

Accordingly, referring to FIG. 5, in the existing LRU algorithm, since the earliest referenced page in the list is replaced, the page will be replaced in order of P8→P7→P6→P5. On the contrary, in the CFLRU algorithm, the page will be replaced in order of P7→P5→P8→P6.

However, in the CFLRU algorithm, when replacing the dirty page, the dirty page is replaced by the LRU list, the replacement cost of the dirty page which has an effect on the flash memory is not considered at all.

Meanwhile, in Korea patent registration No. 0941382, "apparatus and method for managing page buffer linked with flash memory, and apparatus and method for changing page of flash memory", it is proposed a technique that includes a buffer unit which stores data of a page unit read from a flash memory, a buffer management unit which selects replaced data among the data saved in the buffer unit to remove the selected data from the buffer unit if the amount of data saved in the buffer unit reaches a predetermined reference amount, and a page list management unit which generates a page index for a clean page in which a reading operation is performed among the data of the page unit saved in the buffer unit, a clean page list in which a block number including the clean page is written, and a dirty page list for a dirty page in which a writing operation is performed, respectively, and deletes the page index corresponding to the replaced data.

However, in the prior art, the clean page and the dirty page are separately managed to enhance the buffer hit ratio for the dirty page and reduce the entire writing cost. Furthermore, when the data in which the writing operation is performed is replaced, the data included in the same block is replaced together, and thus, there is an advantage in that the lifespan of the flash memory is extended by reducing the number of times performing the deleting operation. However, like the related art, when the dirty page is replaced, the replacement cost of the dirty page which has an effect on the flash memory is not still considered, and thus, the optimal performance is not made in the flash memory system.

Therefore, as the advantage of the present invention, a technique is required, in which the dirty page in the buffer cache is replaced by considering a space to be ensured after evicting and the number of writing times for the flash memory to reduce the writing operation for the flash memory device and improve the performance of the database management system on the basis of the flash memory and the use life span of the storage device.

DISCLOSURE

Technical Problem

The present invention has been made in an effort to reduce a writing operation for a flash memory device in which the writing operation is very slow in comparison with a reading operation.

The present invention has been made in an effort to improve the performance of a database management system (DBMS) on the basis of the flash memory and a use life span of a storage device.

The present invention has been made in an effort to improve the performance and the use life span of the system by reducing a writing operation of the flash memory and operations such as block deleting and garbage collection of the flash memory required in the writing operation of the flash memory.

The present invention has been made in an effort to enhance efficiency of replacement costs of a dirty unit by considering and selecting a space to be ensured after evicting and the number of writing times for the flash memory of a replaced object instead of a simple method of selecting a replaced object (a LRU method) in the related art, in selecting the replaced object when a buffer space is insufficient.

Technical Solution

In order to achieve the objects, a buffer management device having three states on the basis of a flash memory according to an embodiment of the present invention includes a buffer memory unit, a list management unit, a buffer memory management unit, and a log buffer unit.

The buffer memory unit stores data read from a flash memory in a buffer unit and is divided into a hot region and a cold region according to an access frequency and an access time of the stored buffer unit. The list management unit divides and writes a state of the stored buffer unit or a state of a part in the buffer unit into a clean list and a dirty list. The buffer memory management unit selects a replaced buffer unit by referring to the clean list and the dirty list in the cold region and evicts the selected replaced buffer unit in a buffer cache, when it is required to evict the buffer unit because there is no available space in the buffer memory.

In this case, the stored buffer unit may have three states of a clean state, a dirty state, and a semi-clean state according to whether the data included in the stored buffer unit is the same as and different from the data stored in the flash memory corresponding to the stored buffer unit. When the data are the same as each other, the state may be defined as the clean state, when the data are different from each other, the state may be defined as the dirty state, and when the partial data are the same as each other and the remaining partial data are different from each other, the state may be defined as the semi-clean state.

Further, the list management unit may manage the clean list to store a list of the buffer unit in the clean state and a list of the clean part of the buffer unit in the semi-clean state and manage the dirty list to store a list of the butter unit in the dirty state and a list of the dirty part of the buffer unit in the semi-clean state.

Further, the buffer memory management unit may select the buffer unit corresponding to the clean list earlier than the buffer unit corresponding to the dirty list when the replaced buffer unit is selected.

Further, the apparatus may further include a log buffer unit which stores the updated partial data when the partial data in the stored buffer unit is updated, in which the list management unit manages a list of the partial data stored in the log buffer unit as the dirty list and manages a list of the remaining part other than the updated partial data in the stored buffer unit as the clean list.

Further, the log buffer unit may evict the data having a reference capacity to be written on the flash memory when the updated partial data is accumulated and a total amount reaches a predetermined reference capacity.

Further, the buffer memory unit may constitute the data read from the flash memory with a multiple larger size than a maximum key capacity of the index entry included in the read data.

Further, the buffer memory management unit may select a replaced buffer unit that less causes a node split of the flash memory by considering a space to be ensured after the buffer unit corresponding to the dirty list is evicted and the number of writing operation to be performed in the flash memory when it is required to evict the buffer unit corresponding to the dirty list in the buffer memory unit and evicts the selected replaced buffer unit from the buffer cache.

Further, the buffer memory management unit may select a full specific buffer unit as the replaced buffer unit when the data is fully filled in the specific buffer unit among the buffer units stored in the buffer memory unit and select the replaced buffer unit which is less associated with the node split of the flash memory on the basis of the information of the stored buffer unit when there is no buffer unit in which the data is fully filled.

Meanwhile, a method for managing a buffer having three states on the basis of a flash memory according to another embodiment of the present invention includes storing a buffer unit, managing a list, and managing a buffer memory.

In the storing of the buffer unit, data read from the flash memory is stored as a buffer unit in a buffer memory unit divided into a hot region and a cold region according to an access frequency and an access time of the data. In the managing of the list, a state of the stored buffer unit or a state of a part in the buffer unit is divided and written into a clean list and a dirty list. In the managing of the buffer memory, a replaced buffer unit is selected by referring to the clean list and the dirty list in the cold region and the selected replaced buffer unit is evicted from a buffer cache, when it is required to evict the buffer unit because there is no available space in the buffer memory.

Further, in the managing of the buffer memory, the buffer unit corresponding to the clean list is selected earlier than the buffer unit corresponding to the dirty list when the replaced buffer unit is selected.

Further, the method may further include storing the updated partial data in a log buffer unit when the partial data in the stored buffer unit is updated, in which in the managing of the list, a list of the partial data stored in the log buffer unit is managed as the dirty list and a list of the remaining part other than the updated partial data in the stored buffer unit is managed as the clean list.

Further, in the managing of the list, the clean list may be managed to store a list of the buffer unit in the clean state and a list of the clean part of the buffer unit in the semi-clean state and the dirty list may be managed to store a list of the butter unit in the dirty state and a list of the dirty part of the buffer unit in the semi-clean state.

Further, in the managing of the buffer memory, a replaced buffer unit that less causes a node split of the flash memory may be selected by considering a space to be ensured after the buffer unit corresponding to the dirty list is evicted and the number of writing operation to be performed in the flash memory when it is required to evict the buffer unit corresponding to the dirty list in the buffer memory unit and the selected replaced buffer unit may be evicted from the buffer cache.

Further, in the managing of the buffer memory, a full specific buffer unit may be selected as the replaced buffer unit when the data is fully filled in the specific buffer unit among the buffer units stored in the buffer memory unit and the replaced buffer unit which is less associated with the node split of the flash memory on the basis of the information of the stored buffer unit may be selected when there is no buffer unit in which the data is fully filled.

Advantageous Effects

According to the present invention, it is possible to reduce a writing operation for a flash memory device in which the writing operation is very slow in comparison with a reading operation through an efficient buffer managing method and a new index node split policy.

It is possible to improve the performance of a database management system (DBMS) on the basis of the flash memory and a use life span of a storage device.

It is possible to improve the performance and the use life span of the system by reducing a writing operation of the flash memory and operations such as block deleting and garbage collection of the flash memory required in the writing operation of the flash memory.

It is possible to enhance efficiency of replacement costs of a dirty unit by considering and selecting a space to be ensured after evicting and the number of writing times for the flash memory of a replaced object instead of a simple method of selecting a replaced object (a LRU method) in the related art, in selecting the replaced object when a buffer space is insufficient.

It is possible to increase a ratio of index entries in which the writing operation is not required in the flash memory when the buffer unit is evicted from the buffer cache by managing the buffer unit in three states such as clean, dirty, and semi-clean.

It is possible to reduce the number of splits of the index node of the flash memory by maintaining a larger size of the buffer unit than the index node stored in the flash memory.

DESCRIPTION OF DRAWINGS

FIG. 9 is a view illustrating a full-merge commit algorithm and a merge sort algorithm according to the embodiment of the present invention.

BEST MODE OF THE INVENTION

Figure 1:
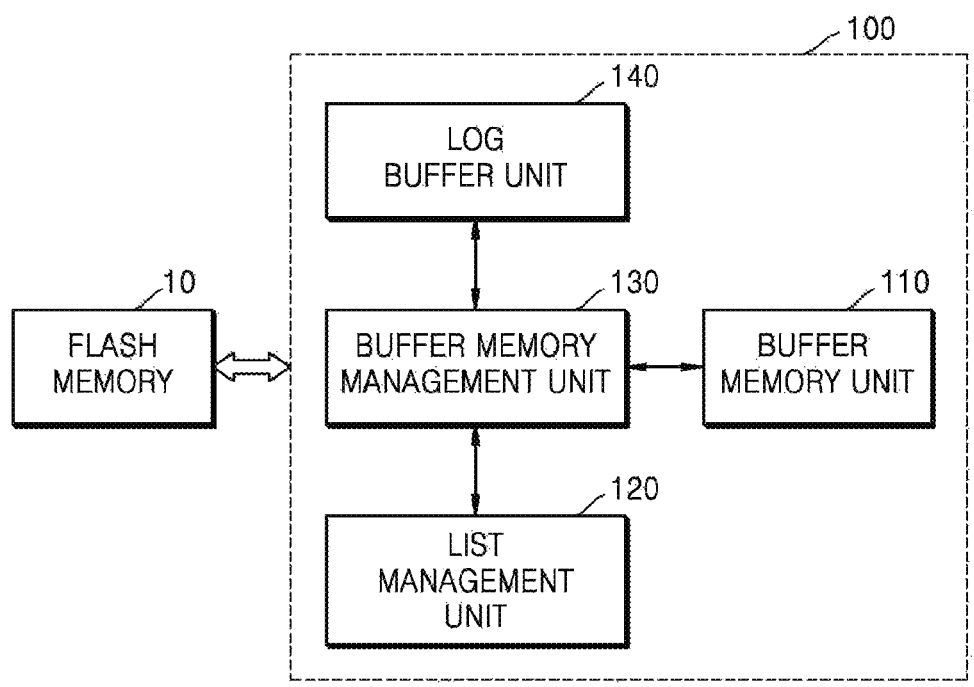
FIG. 1 is a view illustrating a configuration of a buffer management device 100 having three states on the basis of a flash memory according to an embodiment of the present invention.

In order to achieve the objects, a buffer management device having three states on the basis of a flash memory according to an embodiment of the present invention includes a buffer memory unit, a list management unit, a buffer memory management unit, and a log buffer unit.

The buffer memory unit stores data read from a flash memory in a buffer unit and is divided into a hot region and a cold region according to an access frequency and an access time of the stored buffer unit. The list management unit divides and writes a state of the stored buffer unit or a state of a part in the buffer unit into a clean list and a dirty list. The buffer memory management unit selects a replaced buffer unit by referring to the clean list and the dirty list in the cold region and evicts the selected replaced buffer unit in a buffer cache, when it is required to evict the buffer unit because there is no available space in the buffer memory.

In this case, the stored buffer unit may have three states of a clean state, a dirty state, and a semi-clean state according to whether the data included in the stored buffer unit is the same as and different from the data stored in the flash memory corresponding to the stored buffer unit. When the data are the same as each other, the state may be defined as the clean state, when the data are different from each other, the state may be defined as the dirty state, and when the partial data are the same as each other and the remaining partial data are different from each other, the state may be defined as the semi-clean state.

Further, the list management unit may manage the clean list to store a list of the buffer unit in the clean state and a list of the clean part of the buffer unit in the semi-clean state and manage the dirty list to store a list of the butter unit in the dirty state and a list of the dirty part of the buffer unit in the semi-clean state.

Further, the buffer memory management unit may select the buffer unit corresponding to the clean list earlier than the buffer unit corresponding to the dirty list when the replaced buffer unit is selected.

Further, the apparatus may further include a log buffer unit which stores the updated partial data when the partial data in the stored buffer unit is updated, in which the list management unit manages a list of the partial data stored in the log buffer unit as the dirty list and manages a list of the remaining part other than the updated partial data in the stored buffer unit as the clean list.

Further, the log buffer unit may evict the data having a reference capacity to be written on the flash memory when the updated partial data is accumulated and a total amount reaches a predetermined reference capacity.

Further, the buffer memory unit may constitute the data read from the flash memory with a multiple larger size than a maximum key capacity of the index entry included in the read data.

Further, the buffer memory management unit may select a replaced buffer unit that less causes a node split of the flash memory by considering a space to be ensured after the buffer unit corresponding to the dirty list is evicted and the number of writing operation to be performed in the flash memory when it is required to evict the buffer unit corresponding to the dirty list in the buffer memory unit and evicts the selected replaced buffer unit from the buffer cache.

Further, the buffer memory management unit may select a full specific buffer unit as the replaced buffer unit when the data is fully filled in the specific buffer unit among the buffer units stored in the buffer memory unit and select the replaced buffer unit which is less associated with the node split of the flash memory on the basis of the information of the stored buffer unit when there is no buffer unit in which the data is fully filled.

Meanwhile, a method for managing a buffer having three states on the basis of a flash memory according to another embodiment of the present invention includes storing a buffer unit, managing a list, and managing a buffer memory.

In the storing of the buffer unit, data read from the flash memory is stored as a buffer unit in a buffer memory unit divided into a hot region and a cold region according to an access frequency and an access time of the data. In the managing of the list, a state of the stored buffer unit or a state of a part in the buffer unit is divided and written into a clean list and a dirty list. In the managing of the buffer memory, a replaced buffer unit is selected by referring to the clean list and the dirty list in the cold region and the selected replaced buffer unit is evicted from a buffer cache, when it is required to evict the buffer unit because there is no available space in the buffer memory.

Further, in the managing of the buffer memory, the buffer unit corresponding to the clean list is selected earlier than the buffer unit corresponding to the dirty list when the replaced buffer unit is selected.

Further, the method may further include storing the updated partial data in a log buffer unit when the partial data in the stored buffer unit is updated, in which in the managing of the list, a list of the partial data stored in the log buffer unit is managed as the dirty list and a list of the remaining part other than the updated partial data in the stored buffer unit is managed as the clean list.

Further, in the managing of the list, the clean list may be managed to store a list of the buffer unit in the clean state and a list of the clean part of the buffer unit in the semi-clean state and the dirty list may be managed to store a list of the butter unit in the dirty state and a list of the dirty part of the buffer unit in the semi-clean state.

Further, in the managing of the buffer memory, a replaced buffer unit that less causes a node split of the flash memory may be selected by considering a space to be ensured after the buffer unit corresponding to the dirty list is evicted and the number of writing operation to be performed in the flash memory when it is required to evict the buffer unit corresponding to the dirty list in the buffer memory unit and the selected replaced buffer unit may be evicted from the buffer cache.

Further, in the managing of the buffer memory, a full specific buffer unit may be selected as the replaced buffer unit when the data is fully filled in the specific buffer unit among the buffer units stored in the buffer memory unit and the replaced buffer unit which is less associated with the node split of the flash memory on the basis of the information of the stored buffer unit may be selected when there is no buffer unit in which the data is fully filled.

MODES OF THE INVENTION

Hereinafter, embodiments of the present disclosure will be described in detail with reference to the accompanying drawings. Further, in the following description, a detailed explanation of known related technologies may be omitted to avoid unnecessarily obscuring the subject matter of the present invention. Further, in describing the embodiments of the present invention, detailed numerical values are only an embodiment.

The present invention relates to an apparatus and a method for managing a buffer having three states on the basis of a flash memory and proposes a new method for managing a buffer and a lazy-split LRU algorithm. More particularly, the present invention divides and manages states of pages stored in the buffer into three states adding a semi-clean state in addition to existing clean and dirty states and evicts the dirty page from the buffer cache by considering a space to be ensured after evicting and the number of writing times for the flash memory to reduce the writing operation for the flash memory device and improve the performance of a database management system on the basis of the flash memory and a use life span of a storage device.

First, after describing a new data structure (a buffer unit having a B-buffer and three states) applied to the present invention, the present invention will be described below in detail.

In order to achieve the object, the present invention stores data on the flash memory as a basic index structure (B-tree) and uses a buffer memory designed to deal with constrains of the flash memory and reduce the waiting time and energy consumption.

The designed buffer memory means a buffer memory to which the B-tree index structure is applied and defined as the B-buffer in the present invention. The largest feature of the B-buffer may more efficiently maintain a key entry of the index node by increasing the size of the buffer. Further, in the buffer, a flush may be partially performed by arranging and maintaining the key entry in sequence to have an effect on only a specific part of the B-tree index of the flash memory.

Further, in the present invention, the buffer memory uses a buffer unit for increasing the entire hit ratio and maintaining changed contents of a leaf node. In addition, all the changed data of the buffer unit are evicted at an appropriate time to be integrally reflected to the basic index node stored in the flash memory. In the above method, since much data which are less modified is converted by the relatively large writing operation, the present invention improves the use life span of the flash memory by generating a small amount of writing operation in the flash memory unlike the related art.

Figure 6:
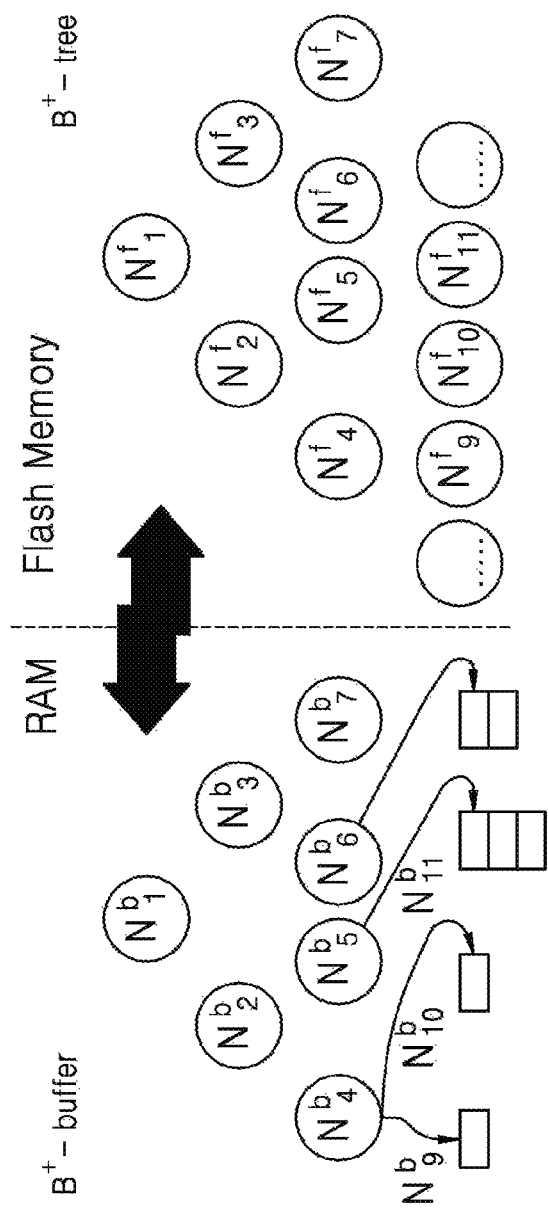
FIG. 6 is a view illustrating a diagram of a B-buffer according to the embodiment of the present invention.

FIG. 6 is a view illustrating a diagram of a B-buffer according to the embodiment of the present invention.

Before describing FIG. 6, first, the understanding for parameters used in the present invention refers to the following Table 1.

TABLE 1

| Parameter | Description |
|---|---|
| S | Entire number of keys |
| $N_i$ | Logical view of B-tree node |
| $N_i^J$ | B-tree node stored in flash memory |
| $N_i^b$ | Buffer unit corresponding to B-tree node |
| $N_i^{b-C}$ | Buffer unit in clean state |
| $N_i^{b-SC}$ | Buffer unit in semi-clean state |
| $N_i^{b-D}$ | Buffer unit in dirty state |
| w | Ratio of cold region in entire buffer memory (window size) |
| Max#ofKey | The number of maximum keys of B-tree |
| #ofNentries | The number of index entries stored in B-tree node |
| #ofBentries | The number of index entries stored in buffer unit |
| #ofNWrites | The number of overwriting times occurring in node when buffer unit is flushed |

In this case, a B-tree node (index node: $N_i^J$) stored in the flash memory and a buffer unit $N_i^b$ stored in the buffer are constituted by a set of index entries xi, and one index entry xi includes a pair of a record key and a pointer for an actual record.

Referring to FIG. 6, it can be seen that in the flash memory, the basic index node ($N_1^f$, $N_2^f$, $N_3^f$, $N_4^f$, $N_5^f$, etc.) is formed as the B-tree structure and in the leaf node ($N_9^f$, $N_{10}^f$, $N_{11}^f$, etc.), the basic index node is formed with one size.

Further, referring to FIG. 6, in a partial region of a random access memory (RAM) having compatibility with a CPU, a buffer cache (alternatively, a buffer memory) for storing a recently used disk block is present. In the present invention, the B-buffer formed by applying the B-tree structure to the buffer cache may be verified.

In the B-buffer, the buffer unit ($N_1^b$, $N_2^b$, $N_3^b$, $N_4^b$, $N_5^b$, etc.) is formed as the B-tree structure, and in the leaf node of the B-buffer, unlike the index node ($N_9^f$, $N_{10}^f$, $N_{11}^f$, etc.) with one size stored in the flash memory, it can be seen that a $N_{11}^b$ nit with a larger size is formed. For example, it can be seen that the buffer unit is formed with three times larger size than the basic index node.

Meanwhile, in the present invention, states of the node cached to the buffer cache are not simply divided into two states such as clean and dirty like the relate art, but divided into three states including semi-clean in addition to the clean and the dirty. The data of the node stored in the buffer cache and the data physically stored in the flash memory corresponding to the data are compared with each other. In this case, when the data stored in the buffer cache and the data physically stored in the flash memory coincide with each other, like the related art, the state of the corresponding node may be defined as the clean state. In addition, when the data stored in the buffer cache and the data physically stored in the flash memory are different from each other, that is, the data stored in the buffer cache is the latest updated data, the state of the corresponding node may be defined as the dirty state. When a part of the data stored in the buffer cache is the same as the data stored in the flash memory and the rest part is different from the data stored in the flash memory, the state may be defined as the semi-clean state.

Three states of the buffer unit $N_i^b$ in the B-buffer may be defined as follows.

(1) A buffer unit $N_i^{b-C}$ in the clean state means that all entries of the buffer unit and logical view data of the B-tree node are the same as each other ($N_i^{b-C}=N_i$), and all of the entries of the buffer unit and all entries stored in the flash memory are the same as each other ($N_i^{b-C}=N_i^J$).

That is, the buffer unit in the clean state means a buffer unit in which the index entry corresponding to the flash memory is not changed after being stored in the buffer memory.

(2) A buffer unit $N_i^{b-SC}$ in the semi-clean state defines a part ($N_i^{b-SC} \neq N_i^J$) in which all of the entries of the buffer unit and the logical view data of the B-tree node are the same as each other ($N_i^{b-SC}=N_i$) and some of the data is changed in the buffer unit and not the same as the entries stored in the flash memory as a dirty part of the semi-clean buffer unit. Further, in the buffer unit, the data is not changed, and thus, the same part $N_i^{b-SC} \cap N_i^J = N_i^J$ as the entries stored in the flash memory is defined as the clean part of the semi-clean buffer unit.

(3) A buffer unit $N_i^{b-D}$ in the dirty state means that all entries of the buffer unit and logical view data of the B-tree node are not the same as each other ($N_i^{b-D} \neq N_i$), and the entire data buffer unit and all entries are changed and not the same as the entries stored in the flash memory ($N_i^{b-D} \neq N_i^J$). Further, the buffer unit in the dirty state may be expressed as $N_i^{b-D} \cup N_i^f = N_i$ or $N_i^{b-D} \cap N_i^f = \emptyset$.

Figure 7:
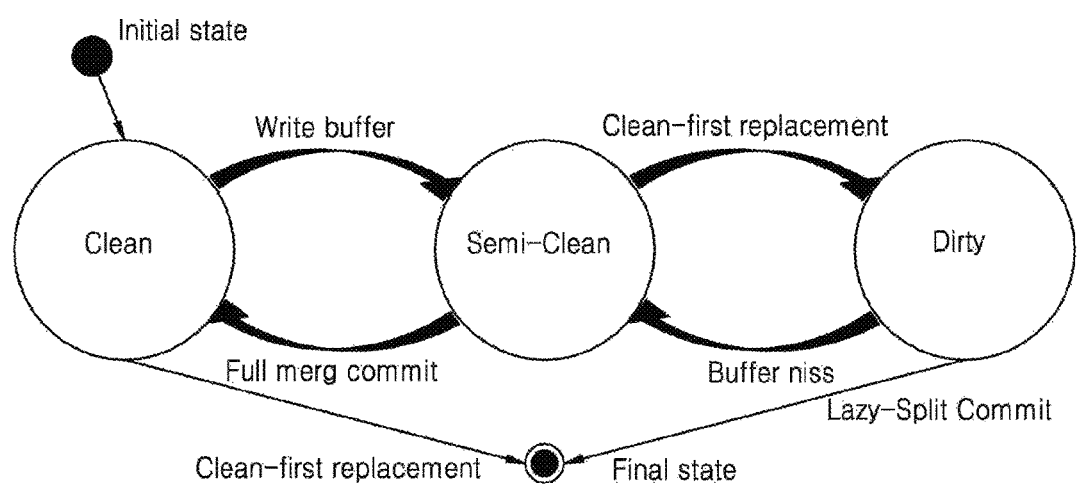
FIG. 7 is a view illustrating a state diagram of a buffer unit according to the embodiment of the present invention.

FIG. 7 is a view illustrating a state diagram of a buffer unit according to the embodiment of the present invention.

A state change until the buffer unit is generated and then evicted in the buffer memory (B-buffer) will be simply described with reference to FIG. 7.

The data read from the flash memory at first is stored in the buffer cache as $N_i^{b-C}$. In addition, when the evicting is required in the buffer memory, $N_i^{b-C}$ is first evicted by a clean-first replacement policy in which $N_i^{b-C}$ is evicted earlier than $N_i^{b-D}$. If some of the data is changed in $N_i^{b-SC}$ a by generating the writing in the buffer, $N_i^{b-C}$ is changed to $N_i^{b-SC}$.

Since the present invention uses the clean-first replacement policy, the buffer unit $N_i^{b-SC}$ which is changed to the semi-clean state once may never return to $N_i^{b-C}$ without synchronization of $N_i^b$ and $N_i^J$. A full merge commit algorithm needs to be used so that $N_i^{b-SC}$ returns to $N_i^{b-C}$ and the detailed description thereof will be described below.

In addition, in the existing CFLRU algorithm, the clean-first replacement policy first selects and evicts the clean state of the dirty state and the clean state, but in the present invention, furthermore, the clean-first replacement policy is used even in $N_i^{b-SC}$.

In the present invention, since $N_i^{b-SC}$ has the clean part and the dirty part, when the evicting is required in $N_i^{b-SC}$, the clean part is evicted earlier than the dirty part of $N_i^{b-SC}$ according to the clean-first replacement policy. Further, $N_i^{b-SC}$ may be changed to $N_i^{b-D}$ by flushing the clean part.

Further, in the present invention, when the data to be found by the CPU is not present in a hot region of the buffer and thus, a buffer miss occurs, the buffer memory management unit finds the corresponding data from the flash memory to store the found data in the buffer memory. In this case, when a specific index node $N_i^J$ which brings from the flash memory is present in $N_i^{b-D}$ in advance, the $N_i^{b-D}$ is changed to $N_i^{b-SC}$.

In addition, in the present invention, the dirty part of the $N_i^{b-SC}$ and the $N_i^{b-D}$ are evicted from the buffer memory by using the lazy-split LRU algorithm, and the detailed description thereof will be described below.

The present invention will be descried in more detail base on the description of the new data structure (the buffer unit having the B-buffer and three states) of the present invention described above.

FIG. 1 is a view illustrating a configuration of a buffer management device 100 having three states on the basis of the flash memory according to the embodiment of the present invention.

Referring to FIG. 1, the buffer management device 100 having three states on the basis of the flash memory of the present invention includes a buffer memory unit 110, a list management unit 120, a buffer memory management unit 130, and a log buffer unit 140.

The buffer memory unit 110 stores data read from a flash memory 10 in a buffer unit and a hot region and a cold region are divided according to an access frequency and an access time of the stored buffer unit. Further, the buffer memory unit 110 may store the data to be stored in the flash memory 10 together.

Figure 3:
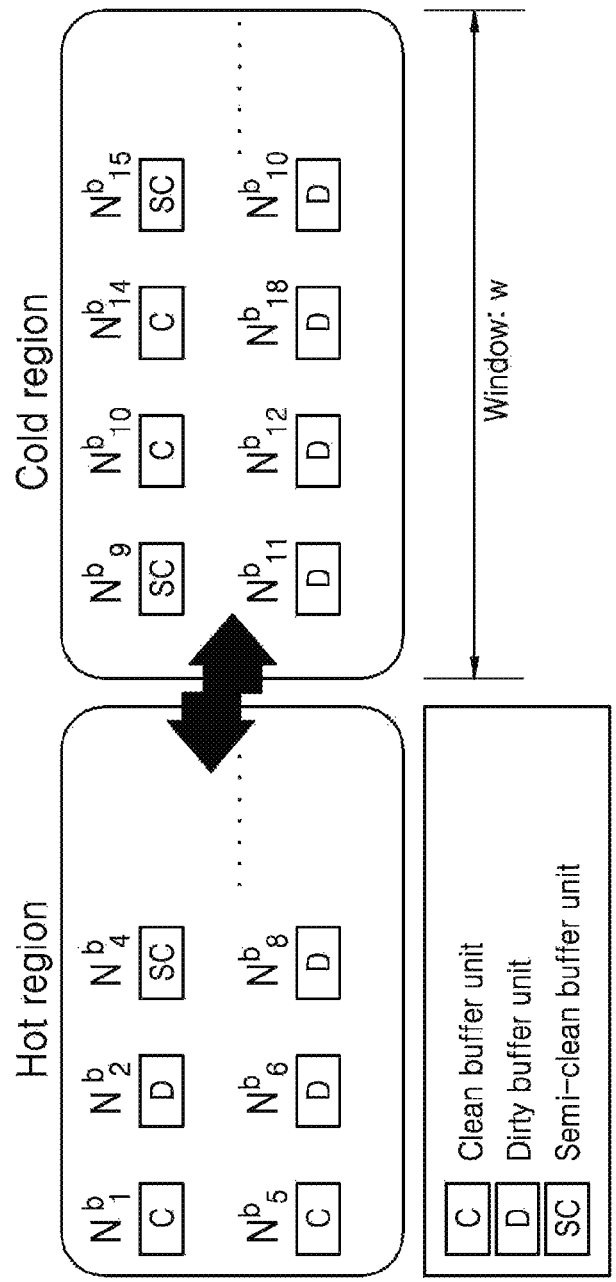
FIG. 3 is a view illustrating a buffer memory structure having three states according to the embodiment of the present invention.

FIG. 3 is a view illustrating a buffer memory structure having three states according to the embodiment of the present invention.

Referring to FIG. 3, the buffer memory unit 110 is divided into a hot region in which the much recently referenced buffer unit is stored and a cold region in which the less recently referenced buffer unit is stored on the basis of the LRU method.

The hot region of the buffer memory unit 110 is formed for increasing the hit ratio of the buffer and the cold region is formed for selecting the replaced buffer unit when the evicting of the buffer unit is required because there is no available space in the buffer memory unit 110. In this case, the size of the cold region is called a window w, and when the size of the window is very large, the hit ratio of the buffer cache may rapidly deteriorate, and thus, it is very important to appropriately control the hit ratio of the buffer cache.

Meanwhile, the buffer cache and the B-buffer described in the present invention correspond to the buffer memory unit 110.

Further, the buffer unit stored in the buffer memory unit 110 has a buffer unit in a clean state, a buffer unit in a dirty state, and a buffer unit in a semi-clean state according to whether all of the data included in the stored buffer unit are the same as and different from the data stored in the flash memory in response to the stored buffer unit. The buffer unit having the three states is described above in detail and will refer to the above description.

Further, the buffer memory unit 110 constitutes the data read from the flash memory 10 with a multiple size larger than the maximum key capacity of the index entry included in the read data to store the read data in the buffer unit. It is described above with reference to FIG. 6 and will refer to the above description.

The list management unit 120 divides and writes a state of the buffer unit stored in the cold region of the buffer memory unit 110 or a state of a part in the buffer unit into a clean list and a dirty list.

The list management unit 120 manages the clean list to store a list of the buffer unit in the clean state and a list of the clean part of the buffer unit in the semi-clean state and manages the dirty list to store a list of the butter unit in the dirty state and a list of the dirty part of the buffer unit in the semi-clean state.

The buffer memory management unit 130 selects a replaced buffer unit by referring to the clean list and the dirty list stored in the list management unit 120 in the cold region of the buffer memory unit 110 when the evicting of the buffer unit is required because there is no available space in the buffer memory unit 110 and evicts the selected replaced buffer unit from the buffer cache.

Further, the buffer memory management unit 130 selects the buffer unit corresponding to the clean list earlier than the buffer unit corresponding to the dirty list when selecting the replaced buffer unit. That is, the buffer memory management unit 130 evicts the clean part in the buffer unit in the clean state and the buffer unit in the semi-clean state earlier than the dirty part in the buffer unit in the dirty state and the buffer unit in the semi-clean state.

The buffer memory management unit 130 may first evict the earlier referenced buffer unit from the buffer memory unit 110 by a method such as the LRU algorithm when evicting the buffer unit corresponding to the clean list and evicts the buffer unit corresponding to the dirty list by considering information (for example, the number of entries included in the buffer unit and the number of overwriting times) on the buffer unit in the dirty state. In this case, when the buffer unit corresponding to the dirty list is evicted, the replaced buffer unit is selected by using the lazy-split LRU algorithm proposed in the present invention.

When the dirty page is evicted from the buffer cache, the writing operation occurs in the flash memory, and thus, the replacement cost of the dirty page is much larger than that of the clean page in terms of the time and the energy consumption.

In the existing LRU algorithm and the CFLRU algorithm, when the dirty page is evicted from the buffer, it is difficult to expect the optimal performance in the flash memory by simply evicting the dirty page in order of the earlier referenced page without considering the cost of the above dirty page.

Accordingly, the buffer memory management unit 130 of the present invention selects (using the lazy-split LRU algorithm) and evicts the replaced buffer unit which less causes the node split of the flash memory by considering the space to be ensured after the buffer unit corresponding to the dirty list is evicted and the number of writing operations to be performed in the flash memory, when the evicting of the buffer unit corresponding to the dirty list is required in the buffer memory unit 110.

Accordingly, the present invention reduces the writing operation generated in the flash memory 10 and improves the performance of the database management system (DBMS) on the basis of the flash memory and the use life span of the storage device by evicting the buffer unit in the dirty state by considering the replacement cost.

Further, when the data is fully filled in a specific buffer unit among the buffer units stored in the buffer memory unit 110, the buffer memory management unit 130 selects the full specific buffer unit as the replaced buffer unit. When there is no buffer unit where the data is fully filled, the buffer memory management unit 130 selects a replaced buffer unit which is less associated with the node split of the flash memory on the basis of the information (for example, the number of entries included in the buffer unit and the number of overwriting times).

The log buffer unit 140 stores some of the updated data when some of the data in the buffer unit stored in the buffer memory unit 110 is updated.

The list management unit 120 manages the list of the partial data stored in the log buffer unit 140 as the dirty list and manages the list of the rest data other than the updated partial data in the buffer unit stored in the log buffer unit 140.

Further, since the log buffer unit 140 has a limited size, when the data stored in the log buffer unit 140 has a predetermined size or more, it is required to ensure the available space of the log buffer unit 140 by forcibly evicting the stored data. For example, when the updated partial data is accumulated and a total of amount reaches a predetermined reference amount (for example, two pages), the log buffer unit 140 may evict the data having the reference amount stored in the log buffer unit 140 to be written on the flash memory.

Hereinafter, the lazy-split LRU algorithm used when the buffer memory management unit 130 evicts the buffer unit corresponding to the dirty list in the buffer memory unit 110 will be described in detail.

When the buffer memory management unit 130 evicts the buffer unit corresponding to the dirty list in the buffer memory unit 110, it is important to efficiently merge the index entries cached from the flash memory 10.

In the related art, as an index buffer replacement policy, there are a first-in and first-out (FIFO) policy, a first-fit evict policy, a first-associated evict policy, an exact-fit evict policy, and the like. The exiting index buffer replacement policy proposes a method of minimizing 110 of the flash memory in the state where the B-tree split is normally performed. However, the present invention proposes a lazy-split LRU evict policy which selects and evicts a dirty node capable of less causing the split of the flash memory based on the statistics, when the dirty part in the buffer unit in the semi-clean state and the buffer unit in the dirty state are evicted.

<Algorithm 1> proposed hereinafter represents the lazy-split LRU replacement algorithm.

---

[Algorithm 1]
Algorithm 1. The Lazy-Spilt Commit Policy

Inputs: a parameter μ, denote a victim unit
Outputs none
 1:   if μ == Null
 2:       let θ denote the set of the disjoint sets of buffer units
 3:       Create Statistical Table
 4:       Use dynamic programming to choose a victim set from θ.
         denoted as α
 5:       let v be the set of the corresponding nodes of α
 6:       SortMerge (α, v)
 7:   else
 8:       Let v be the corresponding node of μ
 9:       SortMerge (μ, v)
10:   Flush ( )
11:   end if

---

The buffer memory management unit 130 selects the replaced buffer unit by referring to the list management unit 120 for ensuring the space of the buffer memory unit 110 when the buffer memory unit 110 of the B-buffer has the predetermined capacity or more.

A method proposed in lines 1 to 6 of the Algorithm 1 is a method of selecting the replaced object used for ensuring the space of the buffer memory, when the there is no buffer unit in which the keys are filled in the buffer memory unit 110, but the buffer space is insufficient.

When there is not the automatically selected replaced buffer unit, the buffer memory management unit 130 generates a statistical table and dynamically selects the replaced buffer unit by using the statistical table.

Figure 4:
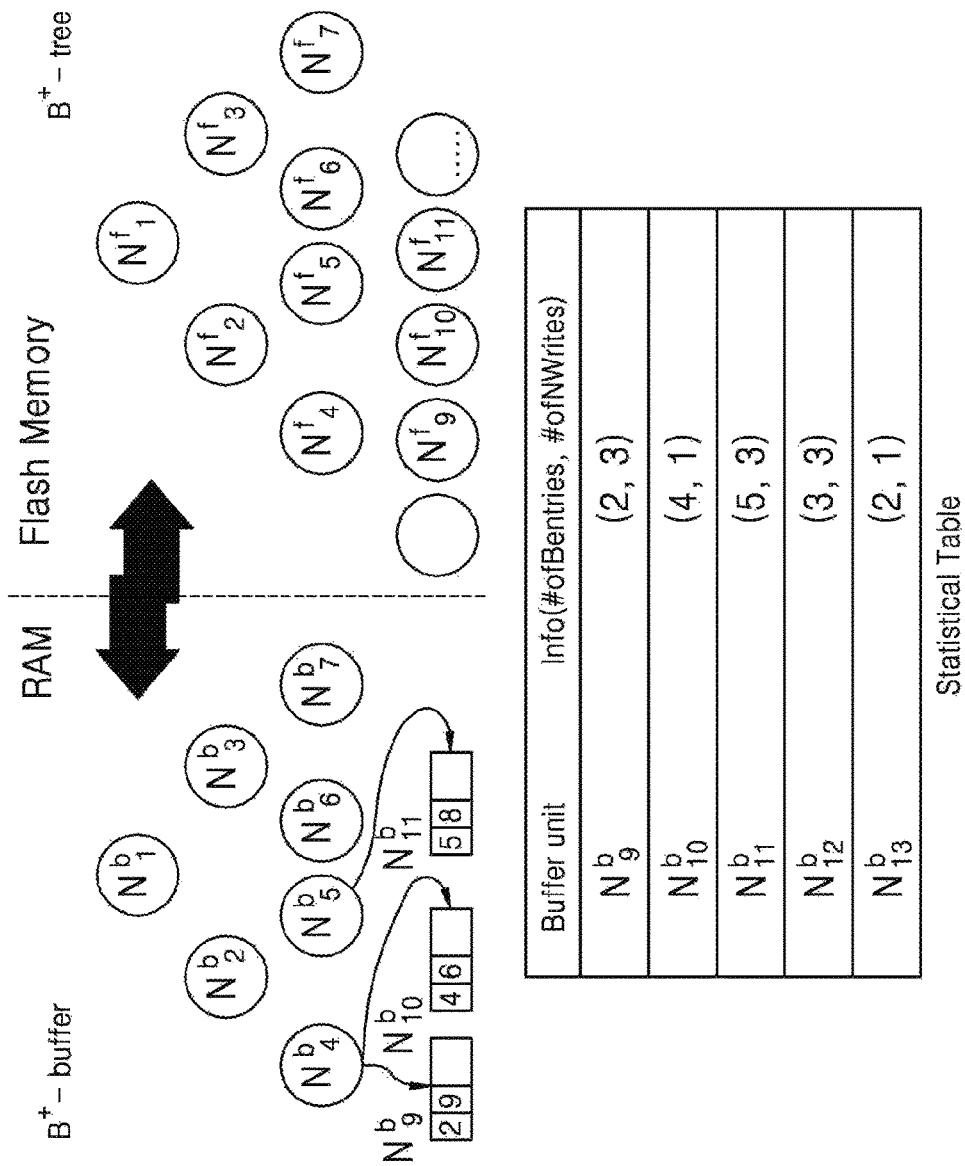
FIG. 4 is a view illustrating a statistical table for five buffer unit according to the embodiment of the present invention.
Figure 5:
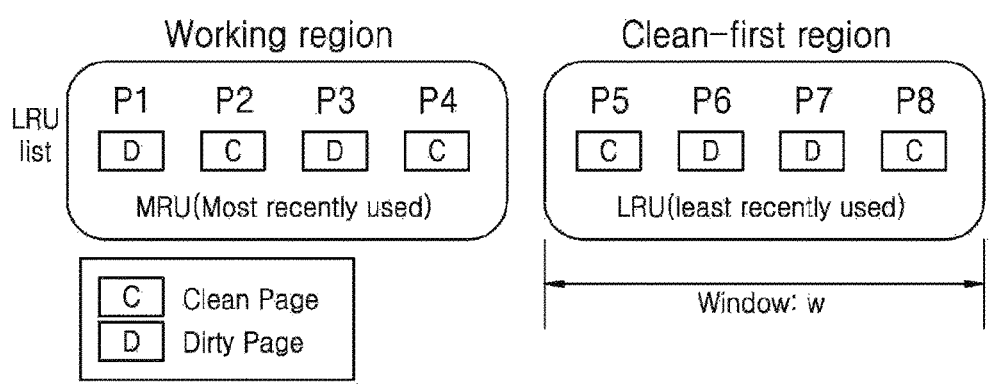
FIG. 5 is a view illustrating a buffer managing method of a CFLRU algorithm in the related art.

FIG. 4 is a view illustrating a statistical table for five buffer units according to the embodiment of the present invention.

Referring to FIG. 4, a buffer unit stored in the buffer memory unit 110 corresponding to the basic index node $N_i^f$ of the B-tree structure stored in the flash memory 10 is defined as $N_i^b$.

The buffer unit $N_i^b$ stored in the buffer memory unit 110 stores information #ofNEntries on the number of many index entries stored in the basic index node and information #ofBEntries on the number of entries of the buffer unit itself.

For example, $N_9^b$ has information #ofBEntries on the number of two entries and information #ofNEntries on the number of nine entries with regard to $N_9^f$.

In addition, when the B-buffer is full, the split policy of the present invention generates a statistical table. The statistical table generated in the buffer memory management unit 130 stores two pieces of information of #ofBEntries and #ofNWrites, #ofBEntries is information on the number of index entries of the buffer unit stored in the buffer unit, and #ofNWrites is information on the number of overwriting times generated in the node when the buffer unit is flushed.

In this case, a value of #ofBEntries stored in the statistical table is directly copied from $N_i^b$ and stored, and a value of #ofNWrites is obtained by using an equation of (#ofBEntries+#ofNEntries)/max#ofKey+2.

For example, the information on the statistical tables 4 and 1 for $N_{10}^b$ means that $N_{10}^b$ has four index entries, and one overwriting occurs and then one writing operation occurs in the flash memory 10 when $N_{10}^b$ is flushed.

Hereinafter, the present invention and the existing buffer replacement policy on the basis of the flash memory to solve the split problem are compared with each other.

In the existing index buffer replacement policy, the changed information is stored in a delta page of the flash memory.

In addition, among the existing index buffer replacement policies, the first-fit evict policy does not actually perform the node split by writing the changed data in the log. However, the first-fit evict policy affects a route node when dividing and thus, may not almost reduce the number of writing operations. Furthermore, the first-fit evict policy visits all the delta pages (generally, a maximum key is designed as 63) associated with the index entry of the logic B-tree node when the data is searched, and thus, a searching time and a main memory use amount will be largely increased.

Meanwhile, among the existing index buffer replacement policies, in the first-associated evict policy, when the evicting is required, a first index item in the buffer is simply selected, an index entry associated with the first index item is selected as a replaced object, and the evicting is performed by considering only the space utilization problem.

For example, in the first-associated evict policy, when $N_9^f$ is divided in the flash memory after three writing operations are performed. That is, the above method is not a method in which the writing cost is optimized.

Accordingly, in the lazy-split LRU replacement algorithms of the present invention, in the method proposed in the lines 1 to 6 of the <Algorithm 1>, the replaced buffer unit is selected by considering the split cost of the B-tree index on the basis of the flash memory.

Meanwhile, a lazy-split LRU replacement method proposed in lines 7 to 10 of the <Algorithm 1> is a method of automatically selecting and evicting the buffer unit as the replaced buffer unit when keys are filled in the specific buffer unit.

In the lazy-split LRU replacement algorithm of the present invention, the node is divided as lazily as possible. To this end, the buffer memory unit 110 stores the buffer unit with K times larger size than the key capacity of the node stored in the flash memory. It is described above with reference to FIG. 6 and will refer to the above description.

In the lazy-split LRU replacement policy of the present invention, the index entry of the buffer unit is flushed and emptied. In addition, the flush may generate an overflow of the node and two or more nodes are required for accommodating the entries of all the keys.

In the present invention, the lazy-split LRU replacement method proposed in lines 7 to 10 of the <Algorithm 1> is called a multi-split commit and the number m of required leaf nodes may be calculated by using Equation of $[k]-1 \leq m \leq [k]+1$.

Figure 8:
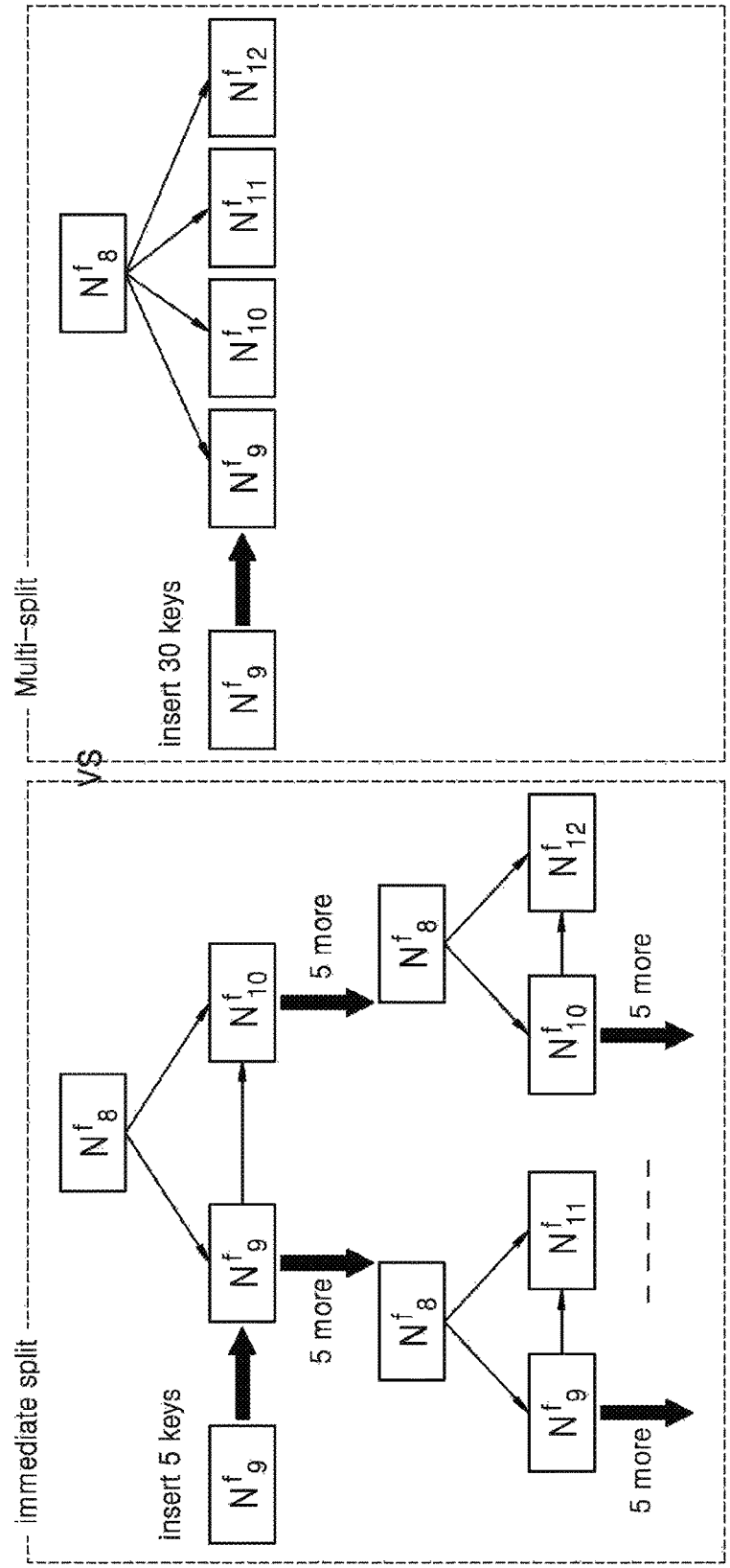
FIG. 8 is a view illustrating comparison of a multi-split according to the embodiment of the present invention and a general node split in the related art.

FIG. 8 is a view illustrating comparison of a multi-split according to the embodiment of the present invention and a general node split in the related art.

Referring to FIG. 8, first, it is assumed that the maximum key capacity of the index node $N_9^f$ of the B-tree is 5 and the buffer unit can be stored with three times larger size. Then, $N_9^b$ may store a maximum of 15 keys.

When 30 keys are inserted, if instant split occurs in the flash memory, the general node split in the related art and the multi-split of the present invention have the following difference.

In the general node split in the related art, since the writing operation in three nodes occurs whenever 5 keys are inserted, 18 writing operations occur in the flash memory in the case where a total of 30 keys are inserted.

Meanwhile, in the multi-split of the present invention, since the node split does not occur until three times larger than the maximal key capacity of $N_9^f$, that is, 15 keys are inserted to $N_9^b$, if all of 15 keys are inserted to the corresponding buffer unit and the buffer unit is fully filled, $N_9^b$ and $N_9^f$ are merged and a leaf node with the maximum $[3]+1=4$ will be formed. Accordingly, in the multi-split method, when a total of 30 keys are inserted, four writing operations occur in the flash memory.

Accordingly, the present invention may much more reduce the writing operation occurring in the flash memory in comparison with the related arts by using the multi-split method proposed in the lines 7 to 10 of the <Algorithm 1>. Therefore, the present invention may improve the performance of the database management system (DBMS) on the basis of the flash memory and the use life span of the storage device.

Meanwhile, in order to recover the collided index, the limitation of the time is required when the buffer unit is written on the flash memory. Further, in the clean-first replacement policy, since the index entry corresponding to the buffer unit in the dirty state may not be neutralized with the keys stored in the flash memory, it is required to solve the unnecessary duplication of the information.

In order to solve the above problem, the lazy-split LRU (LS-LUR) replacement policy proposes a method of replacing the entry of the B-buffer periodically and manually. To this end, the present invention uses a mergesort which is made to one sorted output by merging two sorted inputs of the B-buffer unit and the B-tree node.

FIG. 9 is a view illustrating a full-merge commit algorithm and a merge sort algorithm according to the embodiment of the present invention.

Referring to FIG. 9, <Algorithm 2> is an algorithm representing a procedure of a full merge commit, and Algorithm 3> is an algorithm representing a procedure of a mergesort operating when the B-buffer unit and the B-tree node are merged.

The mergesort includes three steps as follows. In the first step, a key item is divided into two parts. The two parts are constituted by halves of the key entry, respectively. In the second step, returning which performs the mergesort is used, except that the result of the first step is very small. In the third step, the result is combined by merging one sorted key array.

When the mergesort is applied to the LS-LRU, the mergesort is achieved in the first step and the second step in advance. The key is divided into a leaf buffer unit and a node and all of the buffer units or the index nodes are clearly covered.

Accordingly, the present invention may immediately perform a partial merge and obtain the sorted key entries by calling the merge algorithm.

Figure 2:
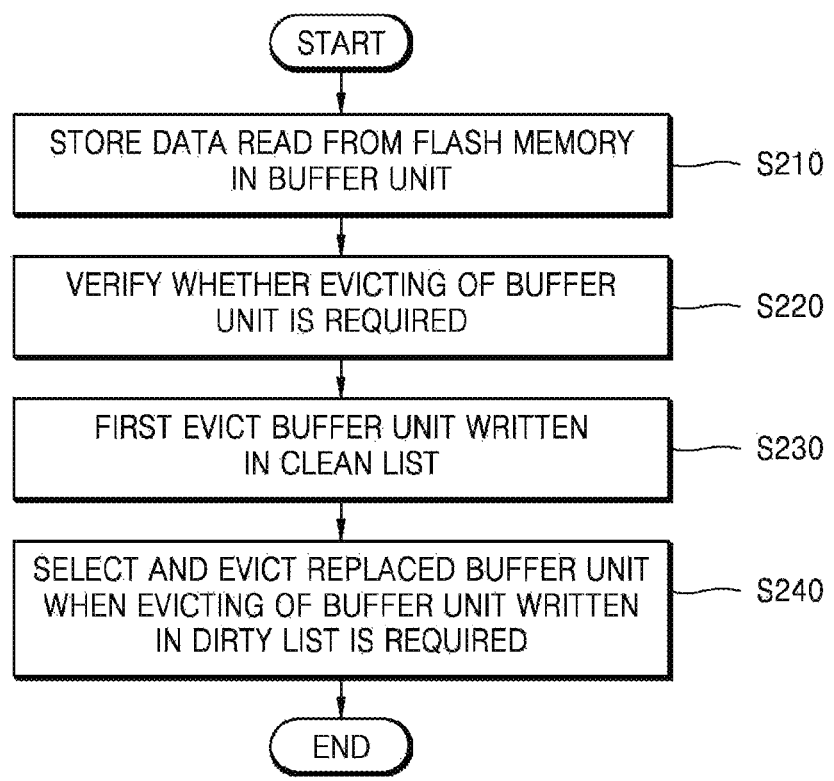
FIG. 2 is a flowchart for a method for managing a buffer having three states on the basis of a flash memory according to another embodiment of the present invention.

FIG. 2 is a flowchart for a method for managing a buffer having three states on the basis of a flash memory according to another embodiment of the present invention. The method will be simply described based on the above described contents.

The buffer memory unit 110 stores the data read from the flash memory 10 in the buffer unit (S210).

In this case, the buffer memory unit 110 is divided into a hot region and a cold region according to an access frequency and an access time of the stored buffer unit. Further, the buffer memory unit 110 may store the data to be stored in the flash memory 10 together.

Further, the buffer memory unit 110 is divided into a hot region in which the much recently referenced buffer unit is stored and a cold region in which the less recently referenced buffer unit is stored on the basis of the LRU method. The detailed description thereof is described with reference to FIG. 3 and hereinafter, the following description will be described.

In step S220, a step of verifying whether evicting of the buffer unit is required, the buffer memory management unit 130 verifies whether the capacity of the buffer memory unit 110 is a predetermined capacity or more. In this case, the buffer memory management unit 130 selects a replaced buffer unit by referring to the list management unit 120 for ensuring the space when the buffer memory unit 110 has the predetermined capacity or more and referring to the list management unit 120 for ensuring the space when the buffer memory unit 110 has the predetermined capacity or more.

In addition, when the evicting of the buffer unit is required because the capacity is insufficient in the buffer memory unit 110, the buffer memory management unit 130 selects the buffer unit corresponding to the clean list earlier than the buffer unit corresponding to the dirty list by referring to the list management unit 120 and evicts the selected buffer unit corresponding to the clean list from the buffer memory unit 110 (S230).

That is, the buffer memory management unit 130 evicts the clean part in the buffer unit in the clean state and the buffer unit in the semi-clean state earlier than the dirty part in the buffer unit in the dirty state and the buffer unit in the semi-clean state.

In this case, the list management unit 120 divides and writes a state of the buffer unit stored in the cold region of the buffer memory unit 110 or a state of a part in the buffer unit into a clean list and a dirty list. Further, the list management unit 120 manages the clean list to store a list of the buffer unit in the clean state and a list of the clean part of the buffer unit in the semi-clean state and manages the dirty list to store a list of the butter unit in the dirty state and a list of the dirty part of the buffer unit in the semi-clean state.

In step S230, when the buffer memory management unit 130 evicts the buffer unit corresponding to the clean list, the earlier referenced buffer unit may be first evicted from the buffer memory unit 110 by a method such as the LRU algorithm.

In addition, when it is required to evict the buffer unit corresponding to the dirty list after all of the buffer units corresponding to the clean list are evicted in the buffer memory unit 110, the buffer memory management unit 130 evicts the buffer unit by considering information (for example, the number of entries included in the buffer unit and the number of overwriting times) on the buffer unit corresponding to the dirty list (S240).

In step S240, the replaced buffer unit may be selected by using the lazy-split LRU, and the detailed description of the lazy-split LRU is described above and will be omitted below.

Accordingly, the present invention may reduce the writing operation generated in the flash memory 10 and improve the performance of the database management system (DBMS) on the basis of the flash memory and the use life span of the storage device by evicting the buffer unit in the dirty state by considering the replacement cost.

Meanwhile, when the partial data in the buffer unit stored in the buffer memory unit 110 is updated, the log buffer unit 140 stores the updated partial data.

The list management unit 120 manages the list of the partial data stored in the log buffer unit 140 as the dirty list and manages the list of the rest data other than the updated partial data in the buffer unit stored in the log buffer unit 140.

Further, since the log buffer unit 140 has a limited size, when the data stored in the log buffer unit 140 has a predetermined size or more, it is required to ensure the available space of the log buffer unit 140 by forcibly evicting the stored data. For example, when the updated partial data is accumulated and a total of amount reaches a predetermined reference amount (for example, two pages), the log buffer unit 140 may evict the data having the reference amount stored in the log buffer unit 140 to be written on the flash memory.

The method for managing the buffer having three states on the basis of the flash memory according to the embodiment of the present invention may be implemented as a program command which may be executed by various computers to be written on a computer readable medium. The computer readable medium may include one or a combination of a program command, a data file, and a data structure. The program command written on the medium may be specially designed and configured for the present invention, or may be publicly known to and used by those skilled in the computer software field. An example of the computer readable recording medium includes a magnetic media, such as a hard disk, a floppy disk, and a magnetic tape, an optical media, such as a CD-ROM and a DVD, a magneto-optical media, such as a floptical disk, and a hardware device, such as a ROM, a RAM, a flash memory, an eMMC, specially formed to store and execute a program command. An example of the program command includes a high-level language code executable by a computer by using an interpreter, and the like, as well as a machine language code created by a compiler. The hardware device may be configured to be operated with one or more software modules in order to perform the operation of the present invention, and an opposite situation thereof is available.

The present invention has been described by the specified matters such as specific components and limited embodiments and drawings, which are provided to help the overall understanding of the present invention and the present invention is not limited to the embodiments, and those skilled in the art will appreciate that various modifications and changes can be made within the scope without departing from an essential characteristic of the present invention.

The spirit of the present invention is defined by the appended claims rather than by the description preceding them, and the claims to be described below and it should be appreciated that all technical spirit which are evenly or equivalently modified are included in the claims of the present invention.

INDUSTRIAL APPLICABILITY

The present invention relates to an apparatus and a method for managing a buffer having three states on the basis of a flash memory and, more specifically, to an apparatus and a method for improving the performance of a database management system (DBMS) on the basis of the flash memory and a use life span of a storage device by reducing a writing operation for a flash memory device in which the writing operation is very slow in comparison with a reading operation, through an efficient buffer managing method and a new index node split policy.

To this end, the buffer management device having three states on the basis of the flash memory according to an embodiment of the present invention comprises: a buffer memory unit; a list management unit; a buffer memory management unit; and a log buffer unit.

The invention claimed is:

1. An apparatus for managing a buffer, the apparatus comprising:
a buffer memory unit which stores data read from a flash memory in buffer units and is divided into a hot region and a cold region according to an access frequency and an access time with respect to the buffer units;
a list management unit which divides and writes a state of each of the buffer units or a state of a part in each of the buffer units into one of a clean list and a dirty list; and
a buffer memory management unit which, when it is required to evict at least one of the buffer units because there is no available space in the buffer memory unit, selects a target buffer unit to be replaced among the buffer units by referring to the clean list and the dirty list in the cold region and evicts the target buffer unit from a buffer cache,
wherein each of the buffer units has one of a clean state, a dirty state, and a semi-clean state according to whether at least a part of data included in each of the buffer units is the same as data stored in the flash memory corresponding to each of the buffer units.

2. The apparatus of claim 1, wherein the list management unit manages the clean list to store a list of at least one buffer unit in the clean state among the buffer units and a list of a clean part of at least one buffer unit in the semi-clean state among the buffer units, and manages the dirty list to store a list of at least one buffer unit in the dirty state among the buffer units and a list of a dirty part of the at least one buffer unit in the semi-clean state.

3. The apparatus of claim 1, wherein the buffer memory management unit selects a buffer unit corresponding to the clean list earlier than a buffer unit corresponding to the dirty list as the target buffer unit.

4. The apparatus of claim 1, wherein the buffer memory unit constitutes the data read from the flash memory with a multiple larger size than a maximum key capacity of an index entry included in the data read from the flash memory.

5. The apparatus of claim 1, further comprising:
a log buffer unit which, when partial data of a specific buffer unit among the buffer units is updated, stores the partial data of the specific buffer unit, wherein the list management unit manages a list of the partial data stored in the log buffer unit as the dirty list and manages a list of residual data of the specific buffer unit as the clean list.

6. The apparatus of claim 5, wherein the log buffer unit, when the partial data is accumulated and a total amount of accumulated partial data reaches a predetermined reference capacity, evicts the accumulated partial data to be written on the flash memory.

7. An apparatus for managing a buffer, the apparatus comprising:
a buffer memory unit which stores data read from a flash memory in buffer units and is divided into a hot region and a cold region according to an access frequency and an access time with respect to the buffer units;
a list management unit which divides and writes a state of each of the buffer units or a state of a part in each of the buffer units into one of a clean list and a dirty list; and
a buffer memory management unit which, when it is required to evict at least one of the buffer units corresponding to the dirty list in the buffer memory unit, selects a target buffer unit of the buffer units that causes a node split of the flash memory less than another buffer unit of the buffer units based on a memory space to be regained after the target buffer unit is evicted and the number of writing operations to be performed in the flash memory, and evicts the target buffer unit from a buffer cache,
wherein the buffer memory management unit, when data is fully filled in a specific buffer unit among the buffer units in the buffer memory unit, selects the specific buffer unit as the target buffer unit, and, when there is no buffer unit in which data is fully filled, selects a buffer unit of the buffer units which causes the node split of the flash memory less than another buffer unit among the buffer units as the target buffer unit based on information of the buffer units.

8. A method for managing a buffer, the method comprising:
storing data read from a flash memory in buffer units in a buffer memory unit divided into a hot region and a cold region according to an access frequency and an access time with respect to the buffer units;
dividing and writing a state of each of the buffer units or a state of a part in each of the buffer units into one of a clean list and a dirty list;
selecting, when it is required to evict at least one of the buffer units because there is no available space in the buffer memory unit, a target buffer unit to be replaced among the buffer units by referring to the clean list and the dirty list in the cold region; and
evicting the target buffer unit from a buffer cache,
wherein each of the buffer units has one of a clean state, a dirty state, and a semi-clean state according to whether at least a part of data included in each of the buffer units is the same as data stored in the flash memory corresponding to each of the buffer units.

9. The method of claim 8, wherein in the selecting the target buffer unit, a buffer unit corresponding to the clean list is selected earlier than a buffer unit corresponding to the dirty list as the target buffer unit.

10. The method of claim 8, further comprising:
storing, when partial data of a specific buffer unit among the buffer units is updated, the partial data of the specific buffer unit in a log buffer unit,
wherein in the dividing and writing the state of each of the buffer units or the state of the part in each of the buffer units, a list of the partial data stored in the log buffer unit is managed as the dirty list and a list of residual data of the specific buffer unit is managed as the clean list.

* * * * *